United States Patent
Iwata et al.

(10) Patent No.: US 9,966,529 B1
(45) Date of Patent: May 8, 2018

(54) MGO INSERTION INTO FREE LAYER FOR MAGNETIC MEMORY APPLICATIONS

(71) Applicant: Headway Technologies, Inc., Milpitas, CA (US)

(72) Inventors: Jodi Mari Iwata, San Carlos, CA (US); Guenole Jan, San Jose, CA (US); Ru-Ying Tong, Los Gatos, CA (US); Po-Kang Wang, Los Altos, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days. days.

(21) Appl. No.: 15/461,779

(22) Filed: Mar. 17, 2017

(51) Int. Cl.
| | |
|---|---|
| *H01L 29/82* | (2006.01) |
| *H01L 43/10* | (2006.01) |
| *H01L 43/08* | (2006.01) |
| *H01L 43/12* | (2006.01) |
| *H01F 10/14* | (2006.01) |

(Continued)

(52) U.S. Cl.
CPC .......... *H01L 43/10* (2013.01); *H01F 10/142* (2013.01); *H01F 10/16* (2013.01); *H01F 10/32* (2013.01); *H01F 41/32* (2013.01); *H01L 43/08* (2013.01); *H01L 43/12* (2013.01)

(58) Field of Classification Search
CPC ......... H01L 43/08; H01L 43/10; H01L 43/12; H01F 10/329; H01F 10/142; H01F 10/32; H01F 10/16; H01F 41/32
See application file for complete search history.

(56) References Cited

U.S. PATENT DOCUMENTS

| | | |
|---|---|---|
| 6,166,948 A | 12/2000 | Parkin et al. |
| 6,743,503 B1 | 6/2004 | Chen |

(Continued)

FOREIGN PATENT DOCUMENTS

| | | |
|---|---|---|
| JP | H11337527 | 12/1999 |
| JP | 2005150303 | 6/2005 |

(Continued)

OTHER PUBLICATIONS

"Current-driven excitation of magnetic multilayers," by J.C. Slonczewski, Journal of Magnetism and Magnetic Materials 159, L-1-L-7, Elsevier, Jun. 1996.

(Continued)

*Primary Examiner* — Yosef Gebreyesus
(74) *Attorney, Agent, or Firm* — Saile Ackerman LLC; Stephen B. Ackerman

(57) ABSTRACT

A magnetic tunnel junction (MTJ) is disclosed wherein first and second interfaces of a free layer (FL) with a first metal oxide (Hk enhancing layer) and second metal oxide (tunnel barrier), respectively, produce perpendicular magnetic anisotropy (PMA) to increase thermal stability. In some embodiments, metal clusters are formed in the FL and are subsequently partially or fully oxidized by scavenging oxygen to generate additional FL/oxide interfaces that enhance PMA, provide an acceptable resistance x area (RA) value, and preserve the magnetoresistive ratio. In other embodiments, a continuous or discontinuous metal (M) or MQ alloy layer within the FL reacts with scavenged oxygen to form a partially oxidized metal or alloy layer that enhances PMA and maintains acceptable RA. M is one of Mg, Al, B, Ca, Ba, Sr, Ta, Si, Mn, Ti, Zr, or Hf, and Q is a transition metal, B, C, or Al.

13 Claims, 8 Drawing Sheets

(51) Int. Cl.
*H01F 10/16* (2006.01)
*H01F 10/32* (2006.01)
*H01F 41/32* (2006.01)

(56) References Cited

U.S. PATENT DOCUMENTS

| | | |
|---|---|---|
| 6,834,005 B1 | 12/2004 | Parkin |
| 6,847,510 B2 | 1/2005 | Childress et al. |
| 6,974,708 B2 | 12/2005 | Homg et al. |
| 7,335,961 B2 | 2/2008 | Guo et al. |
| 7,486,551 B1 | 2/2009 | Li et al. |
| 7,586,781 B2 | 9/2009 | Saitoh et al. |
| 7,630,232 B2 | 12/2009 | Guo |
| 7,742,263 B2 | 6/2010 | Fukumoto et al. |
| 7,817,462 B2 | 10/2010 | Miura et al. |
| 7,863,060 B2 | 1/2011 | Belen et al. |
| 7,902,579 B2 | 3/2011 | Lim et al. |
| 7,936,627 B2 | 5/2011 | Fukami |
| 8,379,429 B2 | 2/2013 | Ishiwata et al. |
| 8,470,462 B2 | 6/2013 | Homg et al. |
| 8,592,927 B2 | 11/2013 | Jan et al. |
| 9,006,704 B2 | 4/2015 | Jan et al. |
| 9,048,411 B2 | 6/2015 | Jan et al. |
| 9,368,551 B2 | 6/2016 | Masuoka et al. |
| 2004/0252539 A1 | 12/2004 | Parkin |
| 2007/0253122 A1 | 11/2007 | Fukuzawa et al. |
| 2008/0026253 A1* | 1/2008 | Yuasa .................. B82Y 25/00 428/811 |
| 2008/0137405 A1 | 6/2008 | Ohno et al. |
| 2008/0204946 A1 | 8/2008 | Ochiai et al. |
| 2009/0213503 A1 | 8/2009 | Sun et al. |
| 2009/0257151 A1 | 10/2009 | Zhang et al. |
| 2009/0303779 A1 | 12/2009 | Chen et al. |
| 2010/0072524 A1 | 3/2010 | Huai et al. |
| 2010/0090261 A1 | 4/2010 | Zheng et al. |
| 2011/0014500 A1 | 1/2011 | Horng et al. |
| 2012/0023386 A1 | 1/2012 | Oh et al. |
| 2012/0205758 A1 | 8/2012 | Jan et al. |
| 2014/0291663 A1* | 10/2014 | Kuo .................. H01L 43/10 257/43 |
| 2014/0355152 A1 | 12/2014 | Park et al. |
| 2016/0211442 A1 | 7/2016 | Cao et al. |
| 2016/0284763 A1 | 9/2016 | Tahmasebi et al. |

FOREIGN PATENT DOCUMENTS

| | | |
|---|---|---|
| JP | 2007123640 | 5/2007 |
| WO | WO 2007015474 | 2/2007 |
| WO | WO 2009101827 | 8/2009 |

OTHER PUBLICATIONS

"A perpendicular-anisotropy CoFeB-MgO magnetic tunnel junction," by S. Ikeda et al., Nature materials, Published online: Jul. 11, 2010/ DOI: 10.1038/NMAT2804, www.nature.com/naturematerials, pp. 1-4.

Current-induced domain wall motion in perpendicularly magnetized CoFeB nanowire, by S. Fukami et al., Applied Physics Letters 98, 082504 (2011) Feb. 2011, doi: http://dx.doi.org/10.1063/1.3558917, pp. 1-3.

"Growth, structure, electroic, and magnetic properties of MgO/Fe(001) bilayers and Fe/MgO/Fe(001) trilayers," by M. Klaua et al., Physical Review B, vol. 64, 134411, Sep. 2001, pp. 1-8.

Co-pending U.S. Pat. No. HT15-013, U.S. Appl. No. 15/196,807, filed Jun. 29, 2016, "Perpendicularly Magnetized Ferromagnetic Layers Having an Oxide Interface Allowing for Improved Control of Oxidation," by Luc Thomas, 36 pgs.

* cited by examiner

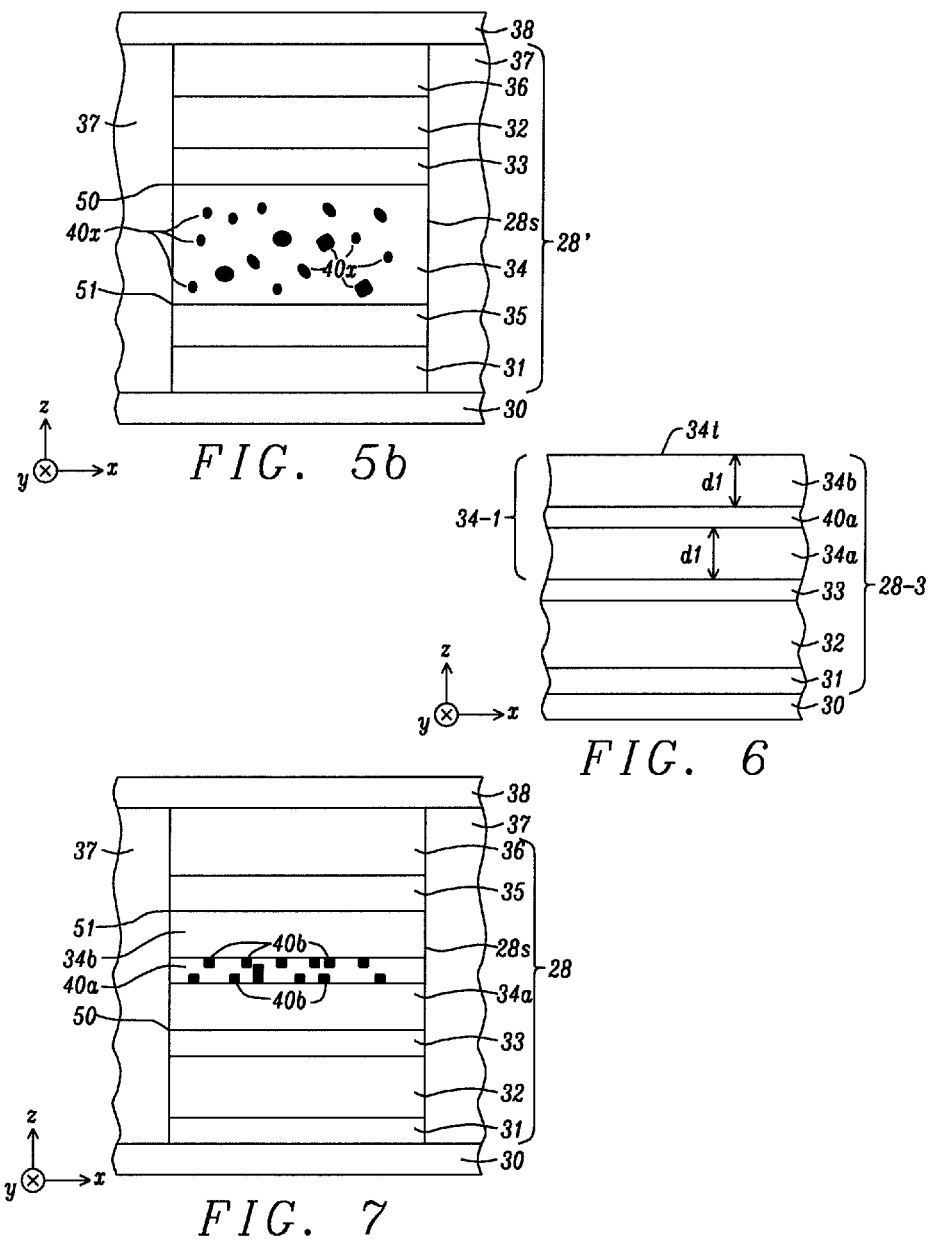

| Element | Oxide | Free energy of formation per mol of $O_2$ ($x10-6$ J.kmol-1) |
|---|---|---|
| Au | $Au_2O_3$ | 109 |
| Ag | $Ag_2O_3$ | -7 |
| Ru | $RuO_2$ | -253 |
| Cu | CuO | -254 |
| Co | CoO | -426 |
| Ni | NiO | -432 |
| Fe | FeO | -488 |
| Fe | $Fe_2O_3$ | -495 |
| Mo | $MoO_2$ | -502 |
| W | $WO_3$ | -509 |
| Sn | SnO | -514 |
| Zn | ZnO | -636 |
| Cr | $Cr_2O_3$ | -699 |
| Nb | $Nb_2O_5$ | -708 |
| Ta | $Ta_2O_5$ | -788 |
| B | $B_2O_3$ | -796 |
| Si | $SiO_2$ | -805 |
| Mn | $Mn_2O_3$ | -854 |
| Ti | $TiO_2$ | -890 |
| Zr | $ZrO_2$ | -1037 |
| Al | $Al_2O_3$ | -1053 |
| Ba | BaO | -1056 |
| Hf | $HfO_2$ | -1084 |
| Mg | MgO | -1146 |
| Ca | CaO | -1208 |

MGO INSERTION INTO FREE LAYER FOR MAGNETIC MEMORY APPLICATIONS

RELATED PATENT APPLICATIONS

This application is related to the following: Ser. No. 15/196,807, filing date Jun. 29, 2016; U.S. Pat. No. 9,006,704; and U.S. Pat. No. 9,048,411, which are assigned to a common assignee and herein incorporated by reference in their entirety.

TECHNICAL FIELD

The present disclosure relates to a magnetic element comprised of a free layer that interfaces with a tunnel barrier layer and an Hk enhancing layer, and wherein the free layer comprises MgO in the form of clusters or non-stoichiometric MgO in a continuous layer that promote higher perpendicular magnetic anisotropy (PMA), better thermal stability, and lower switching current for spintronic applications.

BACKGROUND

Magnetoresistive Random Access Memory (MRAM), based on the integration of silicon CMOS (complementary metal on semiconductor) with magnetic tunnel junction (MTJ) technology, is a major emerging technology that is highly competitive with existing semiconductor memories such as SRAM, DRAM, and Flash. Furthermore, spin-transfer torque (STT) magnetization switching described by C. Slonczewski in "Current driven excitation of magnetic multilayers", J. Magn. Magn. Mater. V 159, L1-L7 (1996), has stimulated considerable interest due to its potential application for spintronic devices such as STT-MRAM on a gigabit scale.

Both field-MRAM and STT-MRAM have a MTJ element based on a tunneling magneto-resistance (TMR) effect wherein a stack of layers has a configuration in which two ferromagnetic layers are separated by a thin non-magnetic dielectric layer. One of the ferromagnetic layers has a magnetic moment that is pinned in a first direction while the other ferromagnetic layer has a magnetic moment that is free to rotate in a direction parallel or anti-parallel to the first direction. As the size of MRAM cells decreases, the use of external magnetic fields generated by current carrying lines to switch the magnetic moment direction of the free layer becomes problematic. One of the keys to manufacturability of ultra-high density MRAMs is to provide a robust magnetic switching margin by eliminating the half-select disturb issue. For this reason, a new type of device called a STT-MRAM was developed. Compared with conventional MRAM, STT-MRAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current traverses a magnetic multilayer in a current perpendicular to plane (CPP) direction, the spin angular moment of electrons incident on a ferromagnetic layer interacts with magnetic moments of the ferromagnetic layer near the interface between the ferromagnetic layer and non-magnetic spacer. Through this interaction, the electrons transfer a portion of their angular momentum to the ferromagnetic free layer. As a result, spin-polarized current can switch the magnetization direction of the ferromagnetic free layer if the current density is sufficiently high, and if the dimensions of the multilayer are small.

For STT-MRAM to be viable in the 90 nm technology node and beyond, the ultra-small MTJ elements (also referred to as nanomagnets) must exhibit a magnetoresistive (MR) ratio that is much higher than in a conventional MRAM-MTJ which uses a NiFe free layer and AlOx as the tunnel barrier layer. Furthermore, the critical current density (Jc) must be lower than about $10^6$ A/cm² to be driven by a CMOS transistor that can typically deliver 100 μA per 100 nm gate width. A critical current for spin transfer switching ($i_C$), which is defined as $[(i_C^+ + i_C^-)/2]$, is generally a few milliamperes. The critical current density (Jc), for example ($i_C/A$), is on the order of several $10^7$ A/cm². This high current density, which is required to induce the spin-transfer effect, could destroy a thin tunnel barrier made of AlOx, MgO, or the like. Thus, an important challenge for high density devices such as STT-MRAM on a gigabit scale is improving spin torque efficiency $E_b/i_c$ where $E_b$ is the energy barrier between the two magnetic states shown in FIG. 1 and described below, and ic is the critical current needed to switch between the magnetic states. It is desirable to decrease $i_c$ (and its Jc) by approximately an order of magnitude so as to avoid an electrical breakdown of the MTJ device and to be compatible with the underlying CMOS transistor that is used to provide switching current and to select a memory cell.

Perpendicular magnetic anisotropy magnetic tunnel junctions (PMA-MTJs) are the building blocks that enable STT-MRAM and other spintronic devices. A preferred implementation is to employ a MTJ with a pinned ferromagnetic layer and free ferromagnetic layer separated by a tunneling oxide layer in a TMR configuration. As shown in FIG. 1, out of plane magnetization also known as perpendicular magnetic anisotropy (PMA) is depicted for pinned layer 10 with a magnetization 11 pointing in a z-axis direction or perpendicular to the film plane, and for free layer 20 with a magnetic moment 21 that is free to rotate either in a (+) or (−) z-axis direction. Tunnel barrier layer 15 is formed between the free layer and pinned layer. The free layer and pinned layer magnetizations are parallel or anti-parallel thereby establishing two different magnetic states. Thus, storage of digital information which is typically in the form of a "0" or "1" is provided by the direction of magnetization in the free layer.

When the free layer has a magnetization direction perpendicular to the plane of the film as in FIG. 1, the critical current ($i_C$) needed to switch the magnetic element is directly proportional to the perpendicular anisotropy field as indicated in equation (1) where e is the electron charge, α is a Gilbert damping constant, Ms is the saturation magnetization of the free layer, h is the reduced Plank's constant, g is the gyromagnetic ratio, and $H_{k_{eff}\perp}$ is the out-of-plane anisotropy field of the magnetic region to switch, and V is the volume of the free layer:

$$i_c = \frac{\alpha e M s V H_{k_{eff}\perp}}{g\hbar} \quad (1)$$

The value $\Delta = kV/k_B T$ is a measure of the thermal stability of the magnetic element where kV is also known as $E_b$ or the energy barrier between the two magnetic states in FIG. 1, $k_B$ is the Boltzmann constant and T is the temperature. Thermal stability is a function of the perpendicular anisotropy field as shown in equation (2):

$$\Delta = \frac{M_S V H_{k_{eff},\perp}}{2k_B T} \quad (2)$$

The perpendicular anisotropy field of the magnetic element is expressed in equation (3) as:

$$H_{k_{eff},\perp} = -4\pi M_S + \frac{2K_U^{\perp,S}}{M_S d} + H_{k,\perp} \quad (3)$$

where $M_s$ is the saturation magnetization, d is the thickness of the magnetic element, $H_{k,\perp}$ is the crystalline anisotropy field in the perpendicular direction, and $K_U^{\perp,S}$ is the surface perpendicular anisotropy of the top and bottom surfaces of the magnetic element. The perpendicular anisotropy field of a magnetic layer (in the absence of strong crystalline anisotropy) is dominated by the shape anisotropy field ($-4\pi M_s$), on which little control is available. At a given thickness, lower magnetization saturation decreases shape anisotropy and the spin-polarized switching current but also decreases thermal stability, which is not desirable. Therefore, one approach for improving spin torque efficiency is to decrease free layer volume and increase Ms.

Since the free layer must be able to withstand 400° C. temperatures during annealing processes necessary for CMOS fabrication, this high temperature requirement has led to the incorporation of refractory materials such as Ta, W, and Mo in the free layer to improve thermal stability. Unfortunately, these metals tend to induce the formation of a dead layer within the free layer. Moreover, free layer thickness is usually increased to recover the lost magnetic moment caused by inserting a refractory metal but this compensation works to lower the perpendicular anisotropy field and thermal stability according to equations (2) and (3) above. Thus, an alternative means of realizing improved thermal stability while maintaining high Ms and decreasing volume in a free layer is needed to provide a PMA-MTJ that will enhance STT-MRAM performance in state of the art devices.

SUMMARY

One objective of the present disclosure is to provide a magnetic element with a free layer having greater out-of-plane magnetization (PMA), and enhanced interfacial perpendicular anisotropy to improve thermal stability to 400° C. while maintaining a high MR ratio and acceptable resistance x area (RA) value.

A second objective is to provide a method of forming the magnetic element of the first objective with a process flow that is compatible with CMOS fabrication.

According to one embodiment, these objectives are achieved by providing a magnetic tunnel junction (MTJ) comprised of a reference layer, tunnel barrier layer, and a free layer with a first surface that interfaces with a first oxide layer (tunnel barrier layer), and a second surface that interfaces with a second oxide layer which is referred to as a Hk enhancing layer. In some embodiments, the Hk enhancing layer comprises a first layer that is a metal oxide and a second layer of TiN. Optionally, the Hk enhancing layer is omitted such that the free layer contacts a capping layer with a bottommost non-magnetic metal or alloy (NM) layer in a bottom spin valve configuration, or is formed on a seed layer with an uppermost NM layer in a top spin valve configuration. The first and second surfaces and free layer regions proximate to the interfaces exhibit substantial interfacial perpendicular anisotropy as a result of contacting an oxide layer and thereby establish substantial PMA in the free layer. In one embodiment, metal oxide clusters are formed within the free layer to further enhance PMA by providing additional oxide interfaces with the free layer. The metal oxide clusters do not form a continuous layer so that the resistance x area (RA) value for the MTJ is maintained at an acceptable level.

Metal oxide clusters are formed according to one embodiment by first sputter depositing metal (M) clusters from a XM target where M is one of Mg, Al, B, Ca, Ba, Sr, Ta, Si, Mn, Ti, Zr, or Hf, and X represents a magnetic metal or alloy that is Co, Fe, CoFe, CoFeB, CoB, and FeB, or alloys thereof. In an alternative embodiment, a XMQ target is sputtered to form metal alloy MQ clusters in the free layer where Q is a transition metal, B, C, or Al, and Q is unequal to M. In a second embodiment, X and M targets, or X, M and Q targets may be co-sputtered to yield a plurality of metal or metal alloy clusters within a free layer.

The present disclosure also anticipates that a lower portion of the free layer containing metal or metal alloy clusters may be formed by XM or XMQ sputter deposition, and then an upper portion of the free layer is deposited in a second step that involves resputtering an upper region of the lower portion. Subsequently, M or alloy MQ is partially oxidized to yield a plurality of metal oxide clusters in a non-stoichiometric oxidation state where a certain number of M and Q atoms remain unoxidized. Alternatively, essentially all of the metal M or alloy QM is oxidized to generate a plurality of metal oxide clusters in a so-called stoichiometric oxidation state.

In another embodiment, the free layer may be comprised of a Heusler alloy including $Ni_2MnZ$, $Pd_2MnZ$, $Co_2MnZ$, $Fe_2MnZ$, $Co_2FeZ$, $Mn_3Ge$, $Mn_2Ga$, and the like where Z is one of Si, Ge, Al, Ga, In, Sn, and Sb. In some embodiments, the free layer is comprised of an ordered $L1_0$ or $L1_1$ material such as MnAl, MnGa, and RT wherein R is Rh, Pd, Pt, Ir, or an alloy thereof, and T is Fe, Co, Ni or an alloy thereof. In yet another embodiment, the free layer comprises a rare-earth alloy including but not limited to TbFeCo, GdCoFe, FeNdB, and SmCo.

The process of oxidizing metal M or alloy MQ comprises metal clusters scavenging and then reacting with oxygen during one or more later steps including free layer deposition, Hk enhancing layer formation, and an annealing step after all layers in the MTJ are deposited. The oxygen may be scavenged from one or more layers including those formed before free layer deposition. As a result, RA is minimized compared with a continuous metal oxide insertion layer in the free layer. In some embodiments, PMA is enhanced and MR ratio is preserved by gettering loosely bound oxygen from the Hk enhancing layer that would otherwise oxidize a portion of the free layer.

The present disclosure also encompasses an embodiment where a thin metal (M) layer or alloy (MQ) layer is deposited on a lower portion of the free layer. The metal or alloy layer may be continuous or discontinuous in the form of islands. Then an upper portion of free layer is formed on the M or MQ layer to give a composite free layer represented by FL1/M/FL2 or FL1/MQ/FL2 where FL1 and FL2 are the lower and upper portions, respectively. During processes including deposition of the FL2 layer, formation of the Hk enhancing layer, and a subsequent annealing step, a portion of the M or MQ layer becomes oxidized to a non-stoichiometric oxidation state. A substantial portion of the M or MQ layer remains unoxidized to minimize an increase in RA. As a result, additional metal oxide interfaces are generated within the free layer to further enhance interfacial perpendicular anisotropy and PMA.

In yet another embodiment, a composite free layer is formed with a laminated configuration represented by FL1/M/FL2/M2/FL3, FL1/M/FL2/M2Q2/FL3, FL1/MQ/FL2/M2Q2/FL3, or FL1/MQ/FL2/M2/FL3 where the composite free layer previously described is modified by sequentially depositing a second metal M2 or second alloy M2Q2 layer and a third free layer (FL3) on a top surface of FL2. Each of FL1, FL2, and FL3 may have a different X composition. Thereafter, one or more of the M, M2, MQ, and M2Q2 layers scavenge and react with loosely bound oxygen from free layers FL1, FL2, and FL3, or from other layers in the MTJ during fabrication of the MTJ or during an annealing step after all MTJ layers are formed. As a result, a portion of each M, M2, MQ, or M2Q2 layer becomes oxidized while a substantial portion thereof remains unoxidized to yield a non-stoichiometric oxidation state in the M, M2, MQ, and M2Q2 layers.

Preferably, the first oxide layer and second oxide layer at top and bottom surfaces of the free layer as well as the metal oxide clusters, or oxidized metal atoms in the M or M2 layer(s) are MgO since magnetic layer (X) interaction with MgO generates greater PMA than with other oxides. In some embodiments, the second oxide layer may have a non-stoichiometric oxidation state and may have a smaller thickness than the first oxide (tunnel barrier) layer in order to maintain RA≤5 to satisfy performance requirements for state of the art magnetic devices. In other embodiments, the Hk enhancing layer is omitted, or the Q content in an oxidized MQ alloy is increased to minimize RA.

Preferably, the capping layer (or seed layer in alternative embodiments) comprises a Ru layer or another metal contacting a surface of the second oxide layer that is facing away from the free layer wherein Ru or the like has a free energy of oxide formation substantially higher than that of Mg. Accordingly, Ru does not absorb oxygen from the second oxide layer so that the oxidation state of the Hk enhancing layer is maintained during a subsequent anneal step. Thus, interfacial perpendicular anisotropy is maintained at a constant level at the second surface due to a stable oxide content in the adjoining Hk enhancing layer.

BRIEF DESCRIPTION OF THE DRAWINGS

FIG. 5b is a cross-sectional view of the MTJ in FIG. 4 after all MTJ layers are formed, and the metal clusters are oxidized to a stoichiometric oxidation state where essentially all of the metal clusters are converted to metal oxide clusters according to another embodiment of the present disclosure.

FIG. 6 is a cross-sectional view of a partially formed MTJ in a bottom spin valve configuration wherein a continuous metal layer is formed between upper and lower portions of a free layer according to an embodiment of the present disclosure.

FIG. 7 is a cross-sectional view of the MTJ in FIG. 6 after all MTJ layers are formed, and the metal layer is partially oxidized to a non-stoichiometric oxidation state according to an embodiment described herein.

DETAILED DESCRIPTION

The present disclosure is based on the discovery that perpendicular surface anisotropy may be enhanced in a PMA-MTJ by including metal oxide clusters, or one or a plurality of non-stoichiometric metal oxide layers within a free layer while preserving MR ratio and achieving an acceptable RA value. The free layer preferably has top and bottom surfaces that each form an interface with a metal oxide layer to lower switching current and increase thermal stability. Although the exemplary embodiments depict MTJ elements with bottom spin valve and top spin valve configurations, the present disclosure also encompasses a MTJ having a dual spin valve structure as appreciated by those skilled in the art. The PMA-MTJ may be incorporated in a MRAM, STT-MRAM or another spintronic device such as a spin torque oscillator, spin hall effect device, magnetic sensor, and a biosensor. The terms interfacial perpendicular anisotropy and perpendicular surface anisotropy may be used interchangeably.

In related U.S. Pat. No. 9,048,411, we disclosed a MTJ structure wherein a free layer forms a first interface at a bottom surface with a first oxide layer (tunnel barrier), and a second interface at a top surface with a second oxide layer (Hk enhancing layer) in order to increase PMA. Furthermore, a moment diluting layer such as Ta or Mg is inserted in the free layer to reduce the perpendicular demagnetizing field. As mentioned earlier, the result is a reduced free layer Ms that tends to offset the increase in thermal stability provided by improved PMA from the second interface.

In related U.S. Pat. No. 9,006,704, we described a MTJ in which switching current is lowered by forming an iron rich CoFeB alloy as a free layer between two metal oxide layers (tunnel barrier and Hk enhancing layer). A capping layer is selected with a greater free energy of oxide formation than the Hk enhancing layer in order to preserve the oxygen content in the latter.

We disclosed in related U.S. patent application Ser. No. 15/196,807 that more than one layer of a reactive metal such as Mg may be inserted in a free layer to give a FL1/Mg/FL2/Mg/FL3 configuration, for example, where FL1-FL3 are magnetic layers within the free layer stack. The upper Mg layer getters oxygen from a Hk enhancing layer that contacts FL3 thereby preventing oxidation of at least the FL3 layer and a loss of MR ratio.

We have surprisingly found that by including metal clusters, or one or more metal layers within a free layer that has a thickness from 5 to 15 Angstroms, the metal insertion scavenges a sufficient amount of oxygen to form a substantial number of metal oxide clusters, or oxidizes a portion of the one or more metal layers to significantly enhance interfacial perpendicular anisotropy and PMA in the free layer without elevating the RA value to an undesirable level, and preserves Ms and the MR ratio to provide improved performance in a STT-MRAM or another spintronic device.

Figure 1:
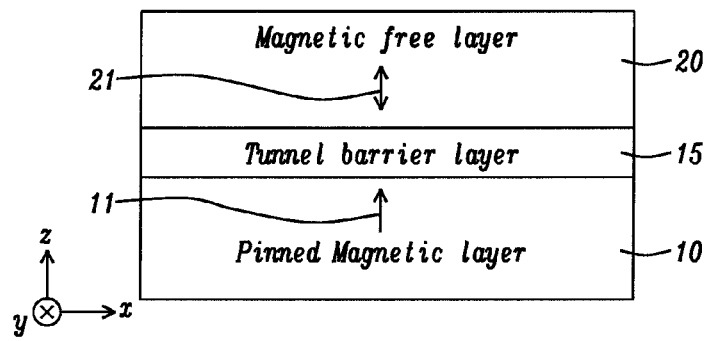
FIG. 1 is a cross-sectional view showing a magnetic tunnel junction (MTJ) with out-of-plane magnetization in the pinned layer and free layer.
Figure 2:
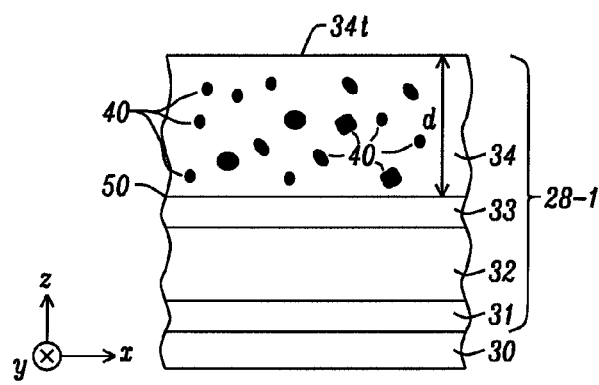
FIG. 2 is a cross-sectional view of a partially constructed MTJ having a bottom spin valve configuration wherein a plurality of metal clusters are formed within a free layer according to an embodiment of the present disclosure.

Referring to FIG. 2, a first step in forming one embodiment of the present disclosure is depicted. A stack of layers 28-1 representing a partially completed MTJ is shown on a first electrode 30 that may be a bottom electrode in a STT-MRAM. In the exemplary embodiment, the stack of layers includes a seed layer 31, reference layer 32, tunnel barrier 33, and a free layer 34 that are sequentially formed on the bottom electrode.

Seed layer 31 is typically a single layer or multilayer made of one or more metals or alloys that promote a uniform thickness in overlying layers. When the reference layer 32 has PMA, a seed layer is chosen that also enhances PMA in the reference layer. In some embodiments, the reference layer is a single magnetic layer that is one or more of Co and Fe that may be alloyed with one or both of B and Ni. Alternatively, the reference layer may have a synthetic antiferromagnetic (SyAF) configuration represented by AP2/coupling layer/AP1 where AP2 is a first magnetic layer on the seed layer, or formed on an optional antiferromagnetic (AFM) layer (not shown), and AP1 is a second magnetic layer that is antiferromagnetically coupled to AP2 through a metal coupling layer that is Ru or the like. In other embodiments, the reference layer, or one or both of AP2 and AP1 in a SyAF configuration is a laminated stack of layers such as $(Co/NO_n)$, $(CoFe/Ni)_n$, $(CoFe/NiCo)_n$, $(CoFe/NiFe)_n$, or the like having inherent PMA and where n is an integer representing the lamination number. There may be a transition layer (not shown) that is one of Co, Fe, CoFe, and CoFeB between the uppermost layer in the laminated stack and the tunnel barrier layer 33.

In a preferred embodiment, tunnel barrier layer 33 is MgO that is formed by sputter depositing a MgO target, or by depositing one or more Mg layers and then oxidizing one or more Mg layers with a known radical oxidation (ROX) or natural oxidation (NOX) method. However, other metal oxides, metal nitrides, or metal oxynitrides known in the art may be employed instead of MgO. It should be understood that the interface of a MgO layer with a magnetic layer that is CoFeB, for example, provides higher interfacial perpendicular anisotropy and a greater magnitude of PMA in the magnetic layer than an interface with other metal oxides.

A key feature is that the free layer 34 formed on the tunnel barrier is comprised of a plurality of metal clusters 40. Preferably, the free layer is a single layer or a multilayer with a composition (X) that is one or more of Co, Fe, CoFe, CoFeB, CoB, and FeB, or alloys thereof including CoFeNi and CoFeNiB. The metal clusters are preferably made of a metal (M) that is Mg but may also be selected from the elements of Al, B, Ca, Ba, Sr, Ta, Si, Mn, Ti, Zr, and Hf. The free layer has a top surface 34t, and a thickness d preferably from 5 to 15 Angstroms.

In an alternative embodiment, the metal clusters 40 may be a MQ alloy where M is unequal to Q, and Q is B, C, Al, or a transition metal such as Pt, Fe, Co, Ni, Ru, Cr, Au, Ag, Cu, or another transition metal selected from Groups 3-12 in the Periodic Table that is used to lower the RA value of the subsequently oxidized metal cluster.

The present disclosure also anticipates that the free layer 34 may be comprised of a material with a high crystalline anisotropy energy constant (Ku) having inherent PMA including Heusler alloys, ordered $L1_0$ or $L1_1$ materials, and rare-earth alloys. Heusler alloys include $Ni_2MnZ$, $Pd_2MnZ$, $Co_2MnZ$, $Fe_2MnZ$, $Co_2FeZ$, $Mn_3Ge$, $Mn_2Ga$, and the like where Z is one of Si, Ge, Al, Ga, In, Sn, and Sb. Ordered $L1_0$ or $L1_1$ materials have a composition such as MnAl, MnGa, and RT wherein R is Rh, Pd, Pt, Ir, or an alloy thereof, and T is Fe, Co, Ni or an alloy thereof. Rare-earth alloys include but are not limited to TbFeCo, GdCoFe, FeNdB, and SmCo.

According to one embodiment, sputtering a single target of XM or XMQ forms free layer 34 with metal clusters 40 therein. During deposition, the M metal or QM alloy is dispersed within the free layer in the form of clusters that may each comprise one or more metal atoms. In an alternative embodiment, co-sputtering X and M targets, or X, M, and Q targets forms metal clusters within the free layer. Since current analytical techniques are unable to determine the exact distribution of metal clusters within the free layer film, the present disclosure anticipates that the metal clusters may be substantially uniformly dispersed. On the other hand, depending on the deposition conditions, the metal clusters may have a greater concentration in one or more portions of the free layer than in other portions of the free layer. For instance, during a co-sputtering process, the forward power applied to the M target may be adjusted during the deposition to temporarily increase or decrease the M concentration in a certain portion of the free layer. Moreover, the exemplary embodiment indicates the metal clusters are believed to have a plurality of sizes and shapes including symmetrical and non-symmetrical shapes.

In another embodiment, one of the aforementioned sputtering or co-sputtering steps may be followed by deposition of only X material to form an upper portion of the free layer. During deposition of the upper portion, a substantial number of metal clusters from the first deposition may be resputtered and redeposited in the upper portion thereby yielding a different distribution of metal clusters 40 in the lower portion than in the upper portion of free layer 34.

Figure 3A:
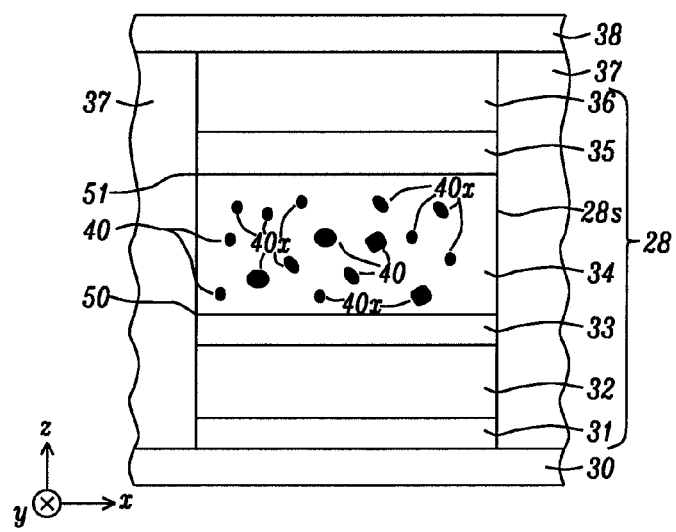
FIG. 3a is a cross-sectional view of the MTJ in FIG. 2 after all MTJ layers are formed and the metal clusters are oxidized to a non-stoichiometric oxidation state where a substantial number of metal clusters remain unoxidized according to an embodiment of the present disclosure.

Referring to FIG. 3a, MTJ 28 is illustrated after an optional Hk enhancing layer 35 and a capping layer 36 are sequentially formed on free layer top surface 34t. A well known photolithography patterning and etching sequence is followed to form sidewall 28s on the MTJ and is not described herein. Thereafter, insulation layer 37 is deposited and electrically isolates the MTJ from adjacent MTJs (not shown). Finally, a top electrode 38 is formed on the MTJ. In the exemplary embodiment, the free layer has a first interface 50 where a bottom surface thereof adjoins the tunnel barrier layer 33, and a second interface 51 where the top surface thereof contacts the Hk enhancing layer 35. In this context, a free layer top surface is defined as one facing away from the tunnel barrier and a bottom surface is one that interfaces with the tunnel barrier. As a result of this configuration where an oxide layer adjoins both of the top and bottom surfaces of the free layer, there is strong perpendicular surface anisotropy, $K_{U,1}^{\perp,S}$ and $K_{U,2}^{\perp,S}$ at the first and second interfaces, respectively, that contribute to $K_U^{\perp,S}$ in equation 3 mentioned earlier.

The Hk enhancing layer 35 is made of a material that provides interfacial perpendicular anisotropy at interface 51 by contacting a surface of the free layer. According to one preferred embodiment, the Hk enhancing layer is comprised of MgO having a thickness and oxidation state that are controlled to give a resistance x area (RA) product smaller than that of the MgO layer in the tunnel barrier layer 33 in order to minimize a decrease in the MR ratio. In an alternative embodiment, the Hk enhancing layer may be comprised of TiN or other oxides including SiOx, SrTiOx, BaTiOx, CaTiOx, LaAlOx, MnOx, VOx, AlOx, TiOx, MgTaOx, and HfOx. Alternatively, the Hk enhancing layer may comprise a first layer that is one of the aforementioned metal oxides and a second layer that is TiN. Moreover, the Hk enhancing layer may be embedded with conductive particles made of one or more of Fe, Co, Ni, Ru, Cr, Au, Ag, and Cu to lower the resistivity therein. For instance, the conductive particles may be 20% to 45% by weight of the Hk enhancing layer. The present disclosure also anticipates the Hk enhancing layer may be a laminate that includes a plurality of oxide layers comprised of one or more of the metal oxides described above. In all embodiments, the Hk enhancing layer may have stoichiometric or non-stoichiometric oxygen content.

In embodiments where the Hk enhancing layer 35 is omitted and capping layer 36 forms the second interface with the free layer, the inclusion of metal clusters 40 within the free layer will also provide an advantage in enhancing PMA and the associated benefits including an improvement in thermal stability. However, there is no longer a second free layer/metal oxide layer interface 51. Accordingly, PMA in free layer 34 is lower than in embodiments where a metal oxide layer adjoins both of the top and bottom surfaces of the free layer. In other embodiments where the Hk enhancing layer is omitted, the free layer contacts a top surface of a seed layer in a top spin valve configuration. Again, metal clusters will be advantageous in improving PMA within the free layer compared with a situation where the free layer has only one metal oxide interface and contains no metal clusters.

The uppermost layer in MTJ 28 is capping layer 36 that may comprise one or more layers when the Hk enhancing layer 35 is present. In embodiments where the Hk enhancing layer is omitted, the capping layer has a stack of at least two layers wherein the bottommost layer may be considered a separate non-magnetic metal or alloy (NM) layer. For example, layer 36 may have a Ru/Ta or Ru/Ta/Ru stack where Ru is the NM layer and Ta (or Ta/Ru) is the capping layer. In some embodiments, a hard mask material such as MnPt may be employed as a NM layer or capping layer. The NM layer preferably has a bcc(001) crystal structure in order to provide optimum lattice matching with a bcc(001) texture in the free layer and thereby enhancing PMA in the free layer although to a lesser extent than the interfacial perpendicular anisotropy generated by a CoFeB/MgO interface.

Figures 18, 19:
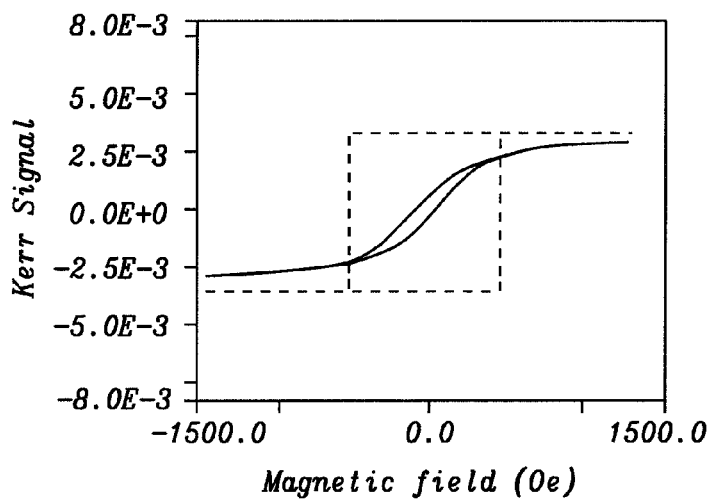
FIG. 18 is a table that lists the free energy of oxide formation for different materials.
FIG. 19 is a plot showing hysteresis loops measured for a MTJ having a single free layer and for a MTJ with a composite free layer formed according to an embodiment of the present disclosure.

In alternative embodiments, other elements may be chosen for the capping layer although materials with a substantially higher free energy of oxide formation compared with the free energy of oxide formation for the metal employed in the Hk enhancing layer 35 are most suitable. FIG. 18 lists the free energy of oxide formation of various elements. Note that if MgO is selected as the Hk enhancing layer, a capping layer material having a free energy of oxide formation substantially higher (less negative) than −1146 kJ/mole is preferred. Thus, elements near the top of the table in FIG. 18 are preferred over elements near the bottom of the table since the former are less easily oxidized than the latter. It follows that Ta is less desirable than Ru as the capping layer metal contacting the Hk enhancing layer since Ta has an affinity for oxygen close to that of Mg which means oxygen is more likely to migrate from the MgO Hk enhancing layer into a Ta capping layer than into a Ru capping layer during annealing. A loss of oxygen from an oxide Hk enhancing layer lowers the interfacial perpendicular anisotropy at the interface with the free layer thereby reducing the induced PMA in free layer 34.

Another key feature of the present disclosure is an oxygen scavenging aspect of the metal clusters. In particular, natural oxidation (NOX) and free radical oxidation (ROX) processes are avoided during free layer formation since NOX or ROX are difficult to control to the extent necessary to prevent unwanted oxidation of the free layer. Instead, the present disclosure relies on the metal clusters gettering oxygen from the tunnel barrier layer 33, Hk enhancing layer 35, and from within the free layer 34 and other MTJ layers during deposition of the free layer, deposition of the Hk enhancing layer, or during subsequent processing such as an annealing step after all layers in the MTJ 28 are formed. In other words, metal M or alloy MQ has a reactivity with oxygen greater than free layer material X with oxygen thereby substantially removing the threat of free layer oxidation by reacting with loosely bound oxygen to form metal oxide clusters 40x. In FIG. 3a, a certain number of metal clusters 40 remain unoxidized to yield what is called a non-stoichiometric oxidation state. Note that oxygen may be scavenged from one or more MTJ layers including layers formed before the free layer is deposited.

As a result of the formation of metal oxide clusters 40x, there is an additional contribution $K_{U3}^{\perp,S}$ to perpendicular surface anisotropy $K_U^{\perp,S}$ in equation 3 resulting from surface contact of the metal oxide clusters with the free layer 34. The total thickness (d) of the free layer is sufficiently thin so that the interfacial perpendicular anisotropy represented by $(K_{U1}^{\perp,S}+K_{U2}^{\perp,S}+K_{U3}^{\perp,S})/M_s d$ is significant compared with the shape anisotropy field in equation 3. For example, the shape anisotropy field 4πMs for a $Co_{20}Fe_{60}B_{20}$ free layer is approximately 12000 Oe. Depending on the composition of the free layer, we have found interfacial perpendicular anisotropy may be >12000 Oe by maintaining thickness (d) in a range of 5 to 15 Angstroms. Under such conditions, substantial PMA is established in the free layer.

An important advantage of metal oxide clusters over a free layer having a continuous metal oxide insertion layer is that interfacial perpendicular anisotropy is maximized with respect to the RA contribution of the metal oxide. In other words, metal oxide molecules in a continuous oxide layer have a substantial amount of surface contact with another metal oxide molecule, which has no effect on the goal of enhancing PMA in the free layer. Furthermore, all metal oxide molecules in a continuous layer raise the RA for the MTJ stack whether or not they interface with the free layer. On the other hand, essentially all of the MgO or metal oxide molecules in a metal oxide cluster contribute to an increase in free layer PMA through the perpendicular surface anisotropy factor in equation 3. Depending on the size and abundance of the metal oxide clusters, a majority of the surface area thereon is believed to be available to form an interface with the free layer. Thus, for a given increase in PMA, RA is minimized with a plurality of metal oxide clusters compared with a continuous metal oxide layer in the free layer. For PMA-MTJs such as MTJ 28, it is desirable to achieve a RA value of 5 or less. However, with a MTJ that has free layer with two oxide interfaces and a continuous metal oxide layer within the free layer, the goal of a RA≤5 is practically impossible to achieve.

Another important benefit of the metal clusters 40 of the present disclosure is a tendency to getter loosely bound oxygen from the Hk enhancing layer 35. We have found that oxidation of a metal layer to form the Hk enhancing layer is difficult to control. Ideally, a stoichiometric oxidation state in the Hk enhancing layer is desirable to generate a maximum amount of interfacial perpendicular anisotropy at interface 51. Unfortunately, in doing so, there is generally a certain volume of loosely bound oxygen within the Hk enhancing layer that tends to diffuse into the free layer during subsequent processing. By including reactive metal clusters within the free layer, the excess oxygen is substantially less likely to oxidize the free layer since there is a greater driving force for the oxygen to react with metal M or alloy QM clusters. Accordingly, MR ratio is preserved by avoiding undesirable side reactions in which portions of the free layer become "dead zones" where magnetic properties are destroyed by oxidation. This capability is not present in a continuous metal oxide layer that has essentially no reactive metal sites.

Note that the total RA value for MTJ 28 is determined by a contribution from each of the oxide layers and metal oxide clusters and is represented by the equation $RA_{TOTAL} = (RA_{33}+RA_{40x}+RA_{35})$ where $RA_{33}$, $RA_{40x}$, and $RA_{35}$ are the resistance x area product for the tunnel barrier, metal oxide clusters, and Hk enhancing layer, respectively. It should be understood that replacing metal M with alloy MQ in metal clusters, or incorporating higher Q content in a metal cluster with a MQ composition is beneficial in lowering the $RA_{40x}$ value and $RA_{TOTAL}$.

RA value is dependent on thickness, and the oxidation state of an oxide layer. Therefore, the RA value may be adjusted lower by using a thinner layer for tunnel barrier 33 or Hk enhancing layer 35, if possible. Typically, the aforementioned layers are already thinned to the extent possible with current technology without sacrificing other properties. Those skilled in the art will recognize that a tradeoff exists in that lowering the oxidation state from stoichiometric MgO to non-stoichiometric MgO, for example, in layers 33, 35 will desirably lower RA, but also undesirably decrease the magnitude of interfacial perpendicular anisotropy at the first and second surfaces, and thereby lower PMA in free layer 34. Thus, the present disclosure presents an attractive alternative where a plurality of metal oxide clusters 40x may be employed to enhance PMA in the free layer while satisfying the requirement of $RA_{TOTAL} \leq 5$.

Figure 3B:
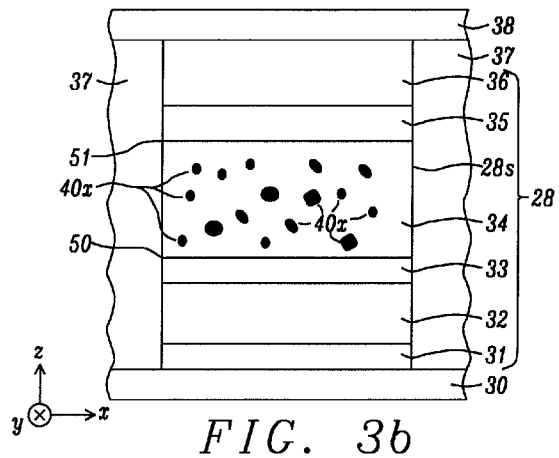
FIG. 3b is a cross-sectional view of the MTJ in FIG. 2 after all MTJ layers are formed, and the metal clusters are oxidized to a stoichiometric oxidation state where essentially all of the metal clusters are converted to metal oxide clusters according to another embodiment of the present disclosure.

Referring to FIG. 3b, a second embodiment is shown where essentially all of the metal clusters 40 in FIG. 2 react with scavenged oxygen during subsequent processing such as formation of the Hk enhancing layer 35, and an annealing step after all layers in MTJ 28 are formed. The annealing step may comprise a temperature proximate to 400° C. that is known for promoting diffusion of loosely bound oxygen from the Hk enhancing layer into the free layer 34. The resulting metal oxide clusters 40x are said to have a stoichiometric oxidation state. Although a somewhat higher RA contribution from metal oxide clusters 40x is expected in this embodiment, $RA_{TOTAL}$ for the MTJ is anticipated to satisfy the objective of $RA_{TOTAL} \leq 5$ since the RA contribution from the tunnel barrier is believed to dominate over that of the Hk enhancing layer and metal oxide clusters.

A key concept is that interfacial perpendicular anisotropy is established within portions of the free layer by contact with a plurality of metal oxide molecules in the clusters. Thus, when a CoFe or CoFeB layer, which normally has in-plane magnetization, adjoins a metal oxide cluster, the magnetization of the portion of free layer in contact with and proximate to a metal oxide cluster becomes aligned out-of-plane under conditions where interfacial perpendicular anisotropy exceeds the shape anisotropy field for the free layer. By employing a plurality of metal oxide clusters, interfacial perpendicular anisotropy and PMA are generated in portions of free layer that are proximate to the metal oxide clusters, and the combined portions with PMA may represent a substantial volume of the free layer.

Figure 4:
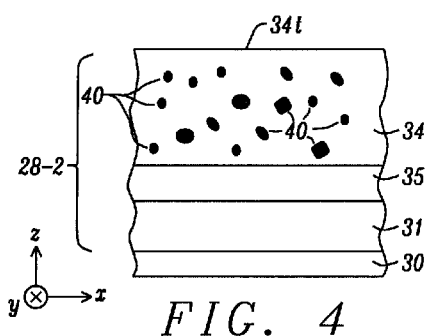
FIG. 4 is a cross-sectional view of a partially constructed MTJ having a top spin valve configuration wherein a plurality of metal clusters are formed within a free layer according to an embodiment of the present disclosure.

In another embodiment depicted in FIG. 4, the bottom spin valve configuration in FIG. 2 is modified by retaining all of the MTJ layers, but the order of deposition is changed to yield a stack of layers 28-2 wherein the seed layer 31, optional Hk enhancing layer 35, and free layer 34 including a plurality of metal clusters 40 are sequentially formed on bottom electrode 30. When the seed layer is comprised of two or more layers, the uppermost layer that contacts the Hk enhancing layer is preferably Ru or another element with a free energy of oxide formation substantially greater than that of the metal selected for the Hk enhancing layer. When the Hk enhancing layer is omitted, seed layer 31 preferably has at least two layers wherein the uppermost layer may be considered a separate non-magnetic metal or alloy (NM) layer with a bcc(001) crystal structure that provides optimum lattice matching with the overlying free layer and promotes PMA therein. For example, seed layer 31 may comprise a lower Ta or TaN seed layer and an upper NM layer that is one or more of Ru, Cu, Ti, Pd, W, Rh, Au, and Ag.

Figure 5A:
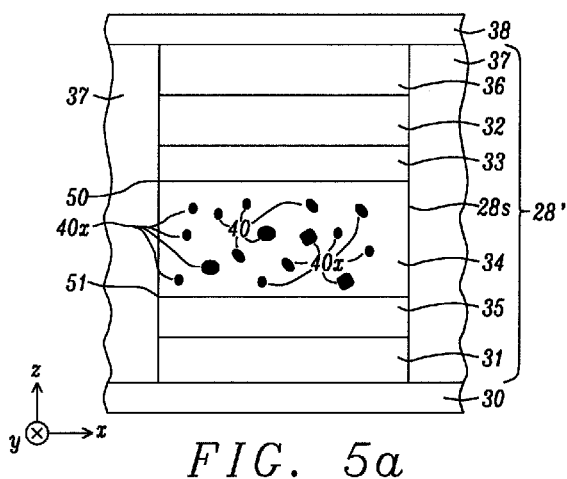
FIG. 5a is a cross-sectional view of the MTJ in FIG. 4 after all MTJ layers are formed, and the metal clusters are oxidized to a non-stoichiometric oxidation state where a substantial number of metal clusters remain unoxidized according to an embodiment of the present disclosure.

In FIG. 5a, a MTJ 28' is shown after tunnel barrier layer 33, reference layer 32, and capping layer 36 are sequentially formed on the partially completed MTJ in FIG. 4. A portion of the metal clusters are oxidized to form a plurality of metal oxide clusters 40x in the free layer by scavenging loosely bound oxygen from the Hk enhancing layer and tunnel barrier layer during free layer formation, tunnel barrier formation, and during subsequent processing that includes an annealing step after all MTJ layers are formed. Also, oxygen may be gettered from adjacent device layers such as insulation layer 37. The first interface 50 is now at a free layer top surface that adjoins the tunnel barrier layer 33, and the second interface 51 is at a free layer bottom surface that adjoins Hk enhancing layer 35. A certain number of metal clusters remain unoxidized in a non-stoichiometric oxidation state.

Referring to FIG. 5b where the stacking order of layers in MTJ 28' in FIG. 5a is retained, the present disclosure also anticipates that under certain conditions, a sufficient volume of loosely bound oxygen is gettered by metal clusters 40 in the FIG. 4 intermediate MTJ structure to oxidize essentially all of the metal clusters to metal oxide clusters 40x in a stoichiometric oxidation state. Oxygen is scavenged from other device layers and MTJ layers including layers formed before free layer deposition as mentioned previously. Transformation of metal clusters to metal oxide clusters may occur during one or more of the steps of depositing the free layer 34, forming the tunnel barrier layer, and during subsequent steps that include an annealing step after all MTJ layers are formed.

Referring to FIG. 6, a partially completed MTJ having a stack of layers 28-3 is depicted according to another embodiment of the present disclosure. In particular, the free layer from previous embodiments is modified to a composite free layer 34-1 that includes a metal layer 40a with a M or MQ composition described previously which separates a first free layer (FL1) 34a from a second free layer (FL2) 34b. The metal or alloy layer may be continuous and has a nominal thickness from 0.5 to 10 Angstroms. Thus, seed layer 31, reference layer 32, tunnel barrier 33, FL1, the metal layer, and FL2 having top surface 34t are sequentially formed on a bottom electrode 30. Each of FL1 and FL2 has a previously described composition X with a thickness d1 from 2 to 10 Angstroms. According to one embodiment, FL1, metal layer 40a, and FL2 are formed in three separate deposition steps.

In FIG. 7, MTJ 28 is completed after optional Hk enhancing layer 35, and capping layer 36 are sequentially formed on FL2 34b. A conventional process is used to generate sidewall 28s. Insulation layer 37 and top electrode 38 are formed as mentioned earlier. A key feature in a preferred embodiment is conversion of a minority of metal or alloy atoms to metal oxide atoms 40b in metal layer 40a. In other embodiments, a majority of metal atoms or a majority of M and Q atoms in the MQ alloy are converted to metal oxide, but a substantial number of metal atoms remain unoxidized.

However, when a majority of metal atoms are oxidized, the RA value for the metal layer may increase to an extent that satisfying the requirement $RA_{TOTAL} \leq 5$ is not achievable. The conversion to metal oxide in metal layer 40a occurs by scavenging loosely bound oxygen from within free layer 34-1, from Hk enhancing layer 35, and under certain conditions from tunnel barrier 33 during one or more processes comprising the deposition of FL2 34b, formation of the Hk enhancing layer, and a subsequent annealing step after all MTJ layers are formed. The scavenged oxygen reacts with at least a minority of metal (M) atoms in the metal layer, or a minority of M or Q atoms in the MQ alloy. Here, the interfacial perpendicular anisotropy term $(K_{U1}^{\perp,S}+K_{U2}^{\perp,S}+K_{U3}^{\perp,S})/M_s d$ is established for FL1 and FL2 by contact with first and second oxide layers described earlier, and with a plurality of metal oxide atoms in layer 40b that has a non-stoichiometric oxidation state. As a result, PMA within the free layer is enhanced while an increase in total RA is minimized compared with a free layer having a continuous metal oxide insertion layer.

In MTJ 28, $RA_{TOTAL}=(RA_{33}+RA_{40b}+RA_{35})$ where $RA_{33}$, $RA_{40b}$, and $RA_{35}$ are the RA product for the tunnel barrier, metal oxide atoms 40b, and Hk enhancing layer, respectively. Accordingly, $RA_{TOTAL} \leq 5$ is satisfied, and the benefit of preserving MR ratio is retained from embodiments relating to metal oxide clusters.

Figure 8:
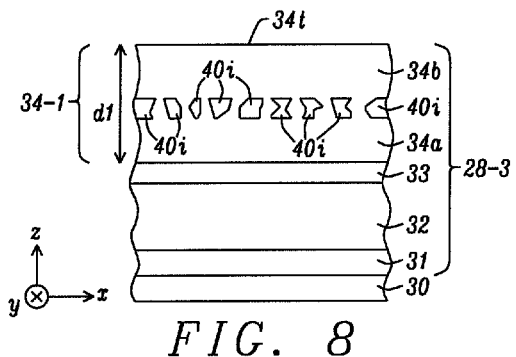
FIG. 8 is a cross-sectional view of a partially formed MTJ in a bottom spin valve configuration wherein a discontinuous metal layer is formed within a free layer according to an embodiment of the present disclosure.

In an alternative embodiment shown in FIG. 8, all aspects of the partially formed MTJ in FIG. 6 are retained except the metal layer between FL1 34a and FL2 34b is a discontinuous layer. A discontinuous metal layer may comprise a plurality of islands 40i with composition M or MQ and having a variety of sizes. The islands may comprise both symmetrical and non-symmetrical shapes. Pathways between the islands may comprise one or both of FL1 and FL2. In one embodiment, FL1, islands 40i, and FL2 are each deposited in a separate step.

Figure 9:
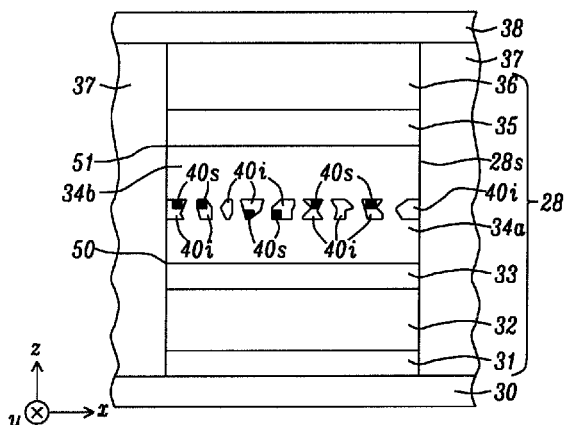
FIG. 9 is a cross-sectional view of the MTJ in FIG. 8 after all MTJ layers are formed, and the discontinuous metal layer is partially oxidized to a non-stoichiometric oxidation state according to an embodiment described herein.

Referring to FIG. 9, islands 40i are partially oxidized to form metal oxide regions 40s on a surface or within an island. In some embodiments, essentially all islands are partially oxidized to a non-stoichiometric oxidation state by scavenging oxygen during one or more process steps described earlier. However, the present disclosure also anticipates a certain number of islands remain unoxidized. Each region 40s forms an interface with FL1 34a or FL2 34b thereby generating interfacial perpendicular anisotropy that enhances PMA within free layer 34-1. $RA_{TOTAL}=(RA_{33}+RA_{40s}+RA_{35})$ where $RA_{40s}$ is the RA product for the metal oxide regions 40s. Meanwhile, $RA_{TOTAL} \leq 5$ is satisfied since the main contributions to $RA_{TOTAL}$ are from $RA_{33}$ and $RA_{35}$. Replacing M with a MQ alloy in islands 40i, or increasing the Q content in islands with a MQ composition is a means of lowering the $RA_{40s}$ contribution from regions 40s, and decreasing $RA_{TOTAL}$.

Figure 10:
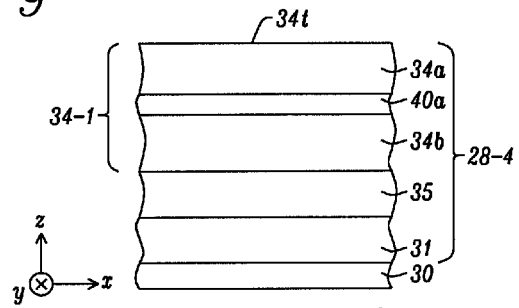
FIG. 10 is a cross-sectional view of a partially constructed MTJ having a top spin valve configuration wherein a metal layer is formed between upper and lower portions of a free layer according to an embodiment of the present disclosure.

In another top spin valve embodiment shown in FIG. 10, the bottom spin valve configuration in FIG. 6 is modified by retaining all of the layers in the partially completed MTJ, but the order of deposition is changed to yield a stack of layers 28-4 wherein the seed layer 31, optional Hk enhancing layer 35, and free layer 34-1 are sequentially formed on bottom electrode 30. Note that FL2 34b contacts the Hk enhancing layer or an NM layer in layer 31 while FL1 34a has top surface 34t. When the Hk enhancing layer is present, the seed layer preferably has an uppermost layer adjoining the Hk enhancing layer that is Ru or another element with a free energy of oxide formation substantially greater than the metal used to form the Hk enhancing layer.

Figure 11:
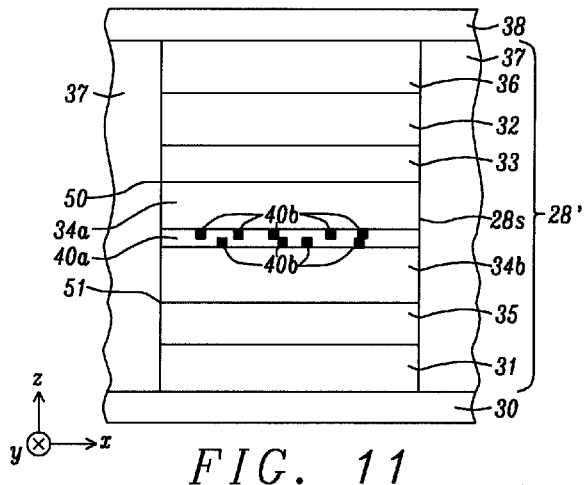
FIG. 11 is a cross-sectional view of the MTJ in FIG. 10 after all MTJ layers are formed, and the metal layer is partially oxidized to a non-stoichiometric oxidation state according to an embodiment described herein.

Referring to FIG. 11, a completely formed MTJ 28' is shown after tunnel barrier layer 33, reference layer 32, and capping layer 36 are sequentially formed on top surface 34t in FIG. 10. Furthermore, at least a minority of metal atoms or alloy MQ in metal layer 40a is oxidized to yield metal oxide atoms 40b that are distributed throughout the metal layer thereby enhancing interfacial perpendicular anisotropy and PMA. As indicated in previous embodiments, metal conversion to metal oxide occurs by scavenging oxygen from adjacent layers and then reaction of metal to form metal oxide. In this case, the conversion occurs during one or more of the processes including deposition of FL1 34a, formation of tunnel barrier 33, and a subsequent annealing step after all MTJ layers are formed. The first interface 50 is at the FL1 top surface that adjoins the tunnel barrier layer 33, and the second interface 51 is at the FL2 bottom surface that contacts Hk enhancing layer 35. Again, metal layer 40a has a non-stoichiometric oxidation state to enable a requirement of $RA_{TOTAL} \leq 5$ to be met while preserving MR ratio.

Figure 12:
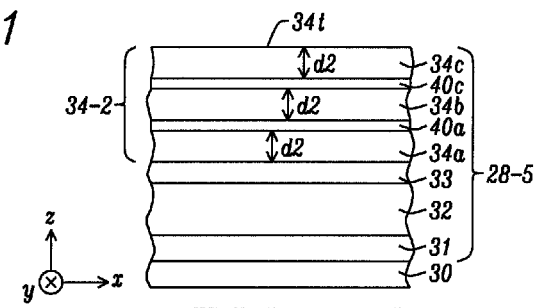
FIG. 12 is a cross-sectional view of a partially formed MTJ having a bottom spin valve configuration wherein a composite free layer has a laminated stack of metal layers and magnetic layers according to an embodiment of the present disclosure.

According to another embodiment depicted in FIG. 12, a partially completed MTJ 28-5 has a composite free layer 34-2 in which free layer 34-1 is modified by sequentially adding a second metal layer 40c and a third free layer (FL3) 34c on FL2 34b. Metal layer 40c preferably comprises a metal M2 or metal alloy M2Q2 where M2 and Q2 are selected from the same elements as M and Q, respectively, that were previously described with respect to metal layer 40. However, M2 in layer 40c may differ from M in layer 40a, and Q2 in layer 40c may differ from Q in layer 40a. FL3 preferably has a composition X described previously. Each of FL1, FL2, and FL3 in free layer 34-2 has a thickness d2 from 2 to 10 Angstroms while each of the M or MQ layer 40a, and M2 or M2Q2 layer 40c has a thickness from 0.5 to 8 Angstroms. Thus, the composite free layer has a FL1/M/FL2/M2/FL3, FL1/M/FL2/M2Q2/FL3, FL1/MQ/FL2/M2Q2/FL3, or FL1/MQ/FL2/M2/FL3 configuration. One or both of the metal layers may be discontinuous.

Figure 13:
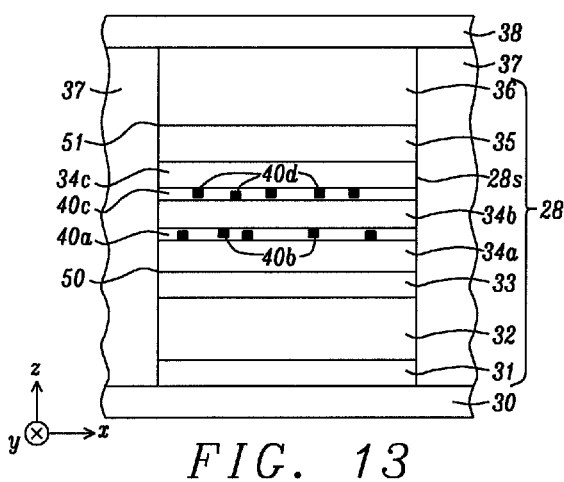
FIG. 13 is a cross-sectional view of the magnetic element in FIG. 12 after all MTJ layers are formed, and each of the two metal layers is partially oxidized to a non-stoichiometric oxidation state according to an embodiment described herein.

In FIG. 13, MTJ 28 is completed after an optional Hk enhancing layer 35, and capping layer 36 are sequentially formed on FL3 34c. A conventional process sequence is employed to generate sidewall 28s, deposit insulation layer 37, and form top electrode 38. In a preferred embodiment, a minority of metal atoms or alloy is converted to metal oxide atoms 40b in metal layer 40a, and a minority of metal atoms or alloy is converted to metal oxide atoms 40d in metal layer 40c. Thus, both metal layers now have a non-stoichiometric oxidation state where the RA values $RA_{40b}$ and $RA_{40d}$ are limited such that the requirement $RA_{TOTAL} \leq 5$ is satisfied. $RA_{TOTAL} = (RA_{33} + RA_{40b} + RA_{40d} + RA_{35})$ where $RA_{33}$, $RA_{40b}$, $RA_{40d}$, and $RA_{35}$ are the RA product for the tunnel barrier, metal oxide atoms 40b, metal oxide atoms 40d, and Hk enhancing layer, respectively.

The oxidation of a certain number of metal atoms in metal layers 40a, 40c occurs by scavenging and reacting with loosely bound oxygen from within the free layer 34-2, from Hk enhancing layer 35, and under certain conditions from tunnel barrier 33 and other MTJ layers, or insulation layer 37 during one or more processes comprising the deposition of FL2 34b, deposition of FL3 34c, formation of the Hk enhancing layer, and a subsequent annealing step after all MTJ layers are formed. Accordingly, interfacial perpendicular anisotropy is generated at interfaces of the metal oxide atoms 40b with FL1 and FL2, and at interfaces of metal oxide atoms 40d with FL2 and FL3. This embodiment is designed to enhance PMA while preserving MR ratio and delivering a $RA_{TOTAL}$ value substantially less than a MTJ wherein the free layer has interfaces with oxide layers at top and bottom surfaces thereof, and where the free layer has a continuous metal oxide insertion layer that is essentially completely oxidized. $RA_{40b}$ and $RA_{40d}$, and $RA_{TOTAL}$ may be adjusted lower by replacing a M metal in metal layers 40a, 40c with a MQ alloy, or by increasing the Q content in a MQ alloy.

Figure 16:
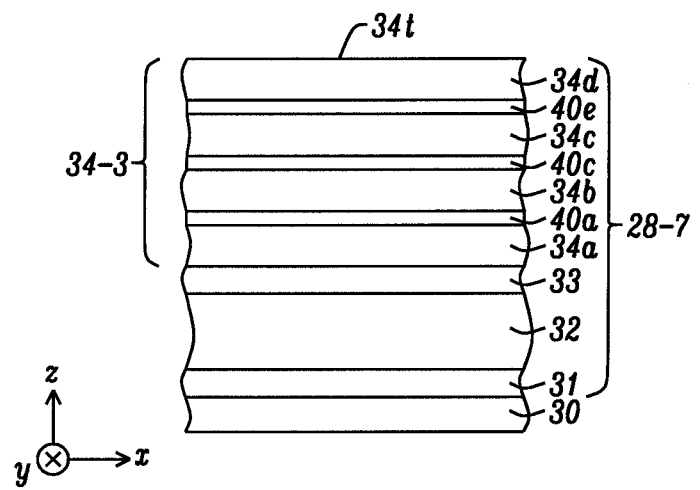
FIG. 16 is a cross-sectional view of a partially formed MTJ having a bottom spin valve configuration wherein a composite free layer has a laminated stack of 3 metal layers and 4 magnetic layers according to an embodiment of the present disclosure.

As shown in FIG. 16, the present disclosure also anticipates a composite free layer 34-3 in which a third metal layer 40e with a M3 or M3Q3 alloy composition where M3 is a M element and Q3 is a Q element, and a fourth free layer (FL4) 34d with an X composition are sequentially formed on FL3 34c in FIG. 12. In this case, each of the metal layers 40a, 40c, 40e in the free layer stack has a thickness from 0.5 to 8 Angstroms. Subsequently, partially formed MTJ 28-7 is completed with the deposition of the optional Hk enhancing layer 35 and the capping layer 36 (not shown) on FL4. Similar to previous embodiments, the first, second, and third metal or alloy layers scavenge oxygen from MTJ layers and surrounding device layers and are transformed to a non-stoichiometric or stoichiometric oxidation state.

Figure 17:
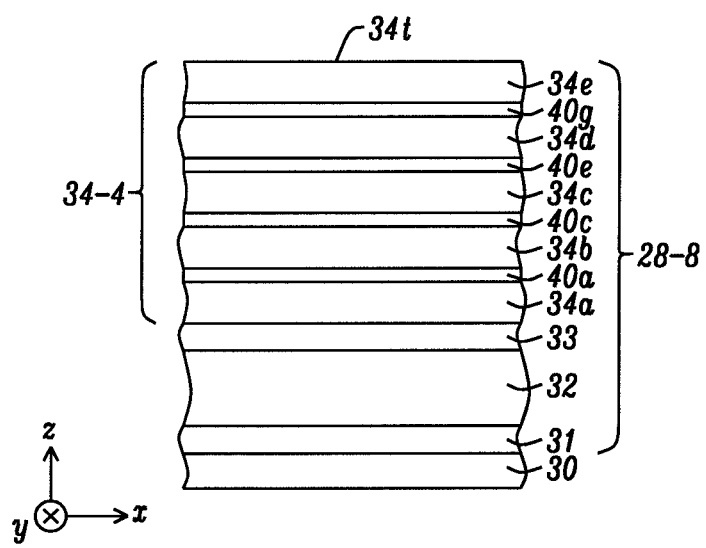
FIG. 17 is a cross-sectional view of a partially formed MTJ having a bottom spin valve configuration wherein a composite free layer has a laminated stack of 4 metal layers and 5 magnetic layers according to an embodiment of the present disclosure.

In another embodiment depicted in FIG. 17, the free layer structure in FIG. 16 is modified to a composite free layer 34-4 by sequentially depositing a fourth metal layer 40g having a M4 or M4Q4 alloy composition where M4 is a M element and Q4 is a Q element, and a fifth free layer (FL5) 34e having an X composition on FL4 34d. Each of the four metal or alloy layers 40a, 40c, 40e, 40g has a thickness from 0.5 to 8 Angstroms while each of FL1-FL5 has a 2 to 10 Angstrom thickness. Thereafter, partially formed MTJ 28-8 is completed with the sequential deposition of an optional Hk enhancing layer, and a capping layer (not shown). Moreover, one or more of M or MQ, M2 or M2Q2, M3 or M3Q3, and M4 or M4Q4 layers scavenges oxygen and is converted to a non-stoichiometric or stoichiometric oxidation state by a method described in earlier embodiments. It should be understood that metal layers 40e and 40g may be continuous or discontinuous layers.

Figure 14:
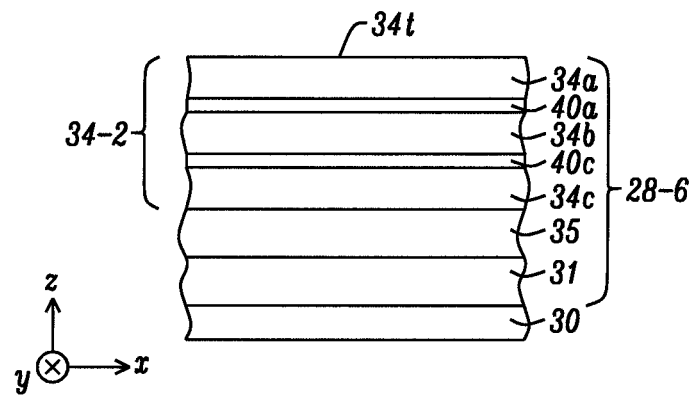
FIG. 14 is a cross-sectional view of a partially formed MTJ having a top spin valve configuration wherein a composite free layer has a laminated stack of metal layers and magnetic layers according to an embodiment of the present disclosure.

In another embodiment shown in FIG. 14, the partially completed MTJ in FIG. 10 is modified to give a stack of layers 28-6. A third free layer FL3 34c and a second metal layer 40c are formed between the optional Hk enhancing layer 35 and FL2 34b. Thus, composite 34-2 free layer is formed by sequentially depositing FL3 34c, metal layer 40c, FL2 34b, metal layer 40a, and FL1 34a on the Hk enhancing layer or on a NM layer in layer 31. Otherwise, all aspects including composition and thickness of the previously described free layer 34-2 are retained.

Figure 15:
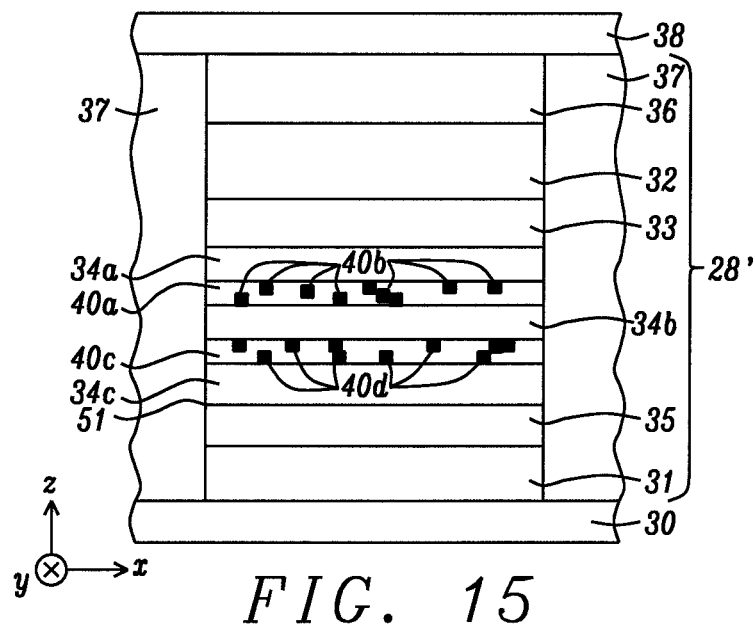
FIG. 15 is a cross-sectional view of the magnetic element in FIG. 14 after all MTJ layers are formed, and each of the two metal layers is partially oxidized to a non-stoichiometric oxidation state according to an embodiment described herein.

Referring to FIG. 15, a completely formed MTJ 28' is shown after tunnel barrier layer 33, reference layer 32, and capping layer 36 are sequentially formed on top surface 34t in FIG. 14. Preferably, a minority of metal atoms or alloy MQ in metal layer 40a, and a minority of metal atoms or alloy M2Q2 in metal layer 40c are oxidized to yield metal oxide atoms 40b, 40d, respectively, that are distributed throughout the metal layers. Oxidation of metal atoms occurs by scavenging and reacting with oxygen from adjacent layers during one or more of the processes including deposition of FL2 34b and FL1 34a, formation of tunnel barrier 33, and a subsequent annealing step after all MTJ layers are formed. First interface 50 is at the FL1 top surface that adjoins the tunnel barrier layer 33, and the second interface 51 is at the FL3 bottom surface that contacts Hk enhancing layer 35 or an NM layer in layer 31. It is critical that metal layers 40a, 40c each have a non-stoichiometric oxidation state to enable a requirement of $RA_{TOTAL} \leq 5$ to be met while preserving MR ratio.

All layers in MTJ 28 or MTJ 28' may be formed in an Anelva C-7100 thin film sputtering system or the like which typically includes three physical vapor deposition (PVD) chambers each having five targets, an oxidation chamber, and a sputter etching chamber. Usually, the sputter deposition process comprises a noble gas such as argon, and oxygen is excluded unless required for tunnel barrier or Hk enhancing layer formation in the oxidation chamber. Once all of the layers in the MTJ stack are laid down on the bottom electrode, a high temperature annealing may be performed in a vacuum oven for 1 to 5 hours at a temperature of about 360° C. to 400° C. Thereafter, an array of MTJ elements including MTJ 28 or MTJ 28' with substantially vertical sidewalls 28s may be fabricated by a process involving a conventional photolithography patterning and reactive ion etch (RIE) sequence as is well known in the art. Subsequently, insulation layer 37 is deposited to electrically isolate adjacent MTJ elements. A chemical mechanical polish (CMP) process is typically employed to form a smooth surface of the insulation layer 37 that becomes coplanar with a top surface of the MTJ array. Then a top electrode array including top electrode 38 is formed on the MTJ and insulation layer to continue the magnetic device fabrication.

To demonstrate an advantage of forming a non-stoichiometric metal oxide layer in a composite free layer according to an embodiment described herein and shown in FIG. 6, a MTJ stack of layers was fabricated where a SyAP reference layer with a (Co/Ni)$_x$/Ru/CoFeB configuration, a MgO tunnel barrier, a FL1/Mg/FL2 free layer, and MgO Hk enhancing layer were sequentially formed on a substrate. Each of FL1 and FL2 is a CoFeB layer with a thickness of 5 Angstroms. As a reference sample, the same MTJ stack was constructed except the Mg layer was omitted between FL1 and FL2 to give a single CoFeB layer with a thickness of 10 Angstroms. Hysteresis loops were measured at room temperature and shown in FIG. 19 for the reference sample (solid line) and for the MTJ with a composite (FL1/Mg/FL2) layer formed according to the present disclosure (dashed line). It should be understood that the Mg layer became partially oxidized to a non-stoichiometric oxidation state during processing that included formation of the Hk enhancing layer, and a subsequent anneal comprising a temperature of 400° C. Furthermore, the MTJ with a composite free layer continued to show substantial PMA after annealing at 400° C. for 5 hours. Therefore, forming a partially oxidized Mg layer within a free layer enhances PMA therein and improves thermal stability during annealing conditions that are typical of CMOS processing. Other embodiments described herein are expected to provide a similar improvement in PMA.

All of the embodiments described herein may be incorporated in a manufacturing scheme with standard tools and processes. A substantial gain in PMA and thermal stability is realized without sacrificing other performance characteristics such as MR ratio and while satisfying the requirement of $RA_{TOTAL} \leq 5$ which are important advantages in enabling 64 Mb and 256 Mb STT-MRAM technology, and related spintronic devices where switching current, RA value, MR ratio, and thermal stability are all critical parameters.

While the present disclosure has been particularly shown and described with reference to, the preferred embodiment thereof, it will be understood by those skilled in the art that various changes in form and details may be made without departing from the spirit and scope of this disclosure.

We claim:

1. A magnetic element, comprising:
   (a) a tunnel barrier layer that is a first metal oxide layer;
   (b) a Hk enhancing layer or a non-magnetic metal or alloy layer (NML); and
   (c) a free layer (FL) with a first surface that forms a first interface with the tunnel barrier layer, a second surface that forms a second interface with the Hk enhancing layer or with the NML, and comprised of a plurality of metal oxide clusters between the first and second surfaces wherein each of the metal oxide clusters form an interface with the free layer thereby enhancing perpendicular magnetic anisotropy (PMA) in the free layer.

2. The magnetic element of claim 1 wherein the tunnel barrier layer, the Hk enhancing layer, and metal oxide clusters are comprised of MgO.

3. The magnetic element of claim 1 wherein the plurality of metal oxide clusters has a stoichiometric oxidation state.

4. The magnetic element of claim 1 wherein the plurality of metal oxide clusters has a non-stoichiometric oxidation state.

5. The magnetic element of claim 1 where the free layer has a thickness from about 5 to 15 Angstroms.

6. The magnetic element of claim 1 wherein the free layer is a single layer or a multilayer of one or more of Co, Fe, CoFe, CoFeB, CoB, FeB, CoFeNi, and CoFeNiB.

7. The magnetic element of claim 1 wherein the free layer is comprised of a high Ku material having inherent PMA which is a Heusler alloy that is $Ni_2MnZ$, $Pd_2MnZ$, $Co_2MnZ$, $Fe_2MnZ$, $Co_2FeZ$, $Mn_3Ge$, or $Mn_2Ga$ where Z is one of Si, Ge, Al, Ga, In, Sn, and Sb, or an ordered $L1_0$ or $L1_1$ material with a composition that is one of MnAl, MnGa, or RT wherein R is Rh, Pd, Pt, Ir, or an alloy thereof, and T is Fe, Co, Ni, or an alloy thereof, or a rare-earth alloy with a TbFeCo, GdCoFe, FeNdB, or SmCo composition.

8. The magnetic element of claim 1 further comprising a seed layer formed on a substrate, a reference layer (RL) on the seed layer, and an uppermost capping layer to yield a seed layer/RL/tunnel barrier layer/FL/Hk enhancing layer/capping layer configuration or a seed layer/RL/tunnel barrier layer/FL/NML/capping layer configuration.

9. The magnetic element of claim 1 further comprising a seed layer formed on a substrate, a reference layer (RL) on the tunnel barrier layer, and a capping layer on the RL to yield a seed layer/Hk enhancing layer/FL/tunnel barrier layer/RL/capping layer configuration, or a seed layer/NML/FL/tunnel barrier layer/RL/capping layer configuration.

10. The magnetic element of claim 1 wherein the Hk enhancing layer is a single layer or a laminate comprised of one or more oxides selected from MgO, SiOx, SrTiOx, BaTiOx, CaTiOx, LaAlOx, MnOx, VOx, AlOx, TiOx, and HfOx, and has a resistance x area (RA) value less than a RA value of the tunnel barrier layer.

11. The magnetic element of claim 1 wherein the Hk enhancing layer is TiN, or is comprised of a first layer made of one of MgO, SiOx, SrTiOx, BaTiOx, CaTiOx, LaAlox, MnOx, VOx, AlOx, TiOx, and HfOx, and a second layer that is TiN.

12. The magnetic element of claim 1 wherein the metal oxide clusters are comprised of an element (M) that is Mg, Al, B, Ca, Ba, Sr, Ta, Si, Mn, Ti, Zr, Hf, or comprise M and an element Q where Q is unequal to M, and Q is B, C, Al, or a transition metal.

13. The magnetic element of claim 1 wherein the free layer, tunnel barrier layer, Hk enhancing layer, and NML are part of a MRAM, STT-MRAM, or another spintronic device that is a spin torque oscillator, spin hall effect device, magnetic sensor, or a biosensor.

* * * * *